(12) United States Patent
Kumura et al.

(10) Patent No.: US 6,967,367 B2
(45) Date of Patent: Nov. 22, 2005

(54) FERRO-ELECTRIC MEMORY DEVICE AND METHOD OF MANUFACTURING THE SAME

(75) Inventors: Yoshinori Kumura, Yokohama (JP); Iwao Kunishima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/805,208

(22) Filed: Mar. 22, 2004

(65) Prior Publication Data

US 2005/0167716 A1    Aug. 4, 2005

(30) Foreign Application Priority Data

Feb. 4, 2004    (JP) .............................. 2004-028099

(51) Int. Cl.[7] ........................ H01L 29/76; H01L 29/94; H01L 31/062; H01L 31/113; H01L 31/119
(52) U.S. Cl. .................... 257/295; 257/296; 257/303
(58) Field of Search ............................. 257/295, 296, 257/303, 306, 310

(56) References Cited

U.S. PATENT DOCUMENTS 6,101,085 A * 8/2000 Kawahara et al. .......... 361/312
6,724,026 B2 * 4/2004 Jacob et al. ................ 257/295

FOREIGN PATENT DOCUMENTS

JP    10-41478    2/1998

\* cited by examiner

*Primary Examiner*—Hoai Pham
(74) *Attorney, Agent, or Firm*—Oblon, Spivak, McClelland, Maier & Neustadt, P.C.

(57) ABSTRACT

A ferro-electric memory device includes a semiconductor substrate, a first transistor formed on the semiconductor substrate, and a first ferro-electric capacitor electrically connected to the first transistor and formed of a first capacitor material layer having a first lower electrode, a first ferro-electric film, and a first upper electrode, the first ferro-electric capacitor being thicker at its central portion than at its ends.

6 Claims, 13 Drawing Sheets

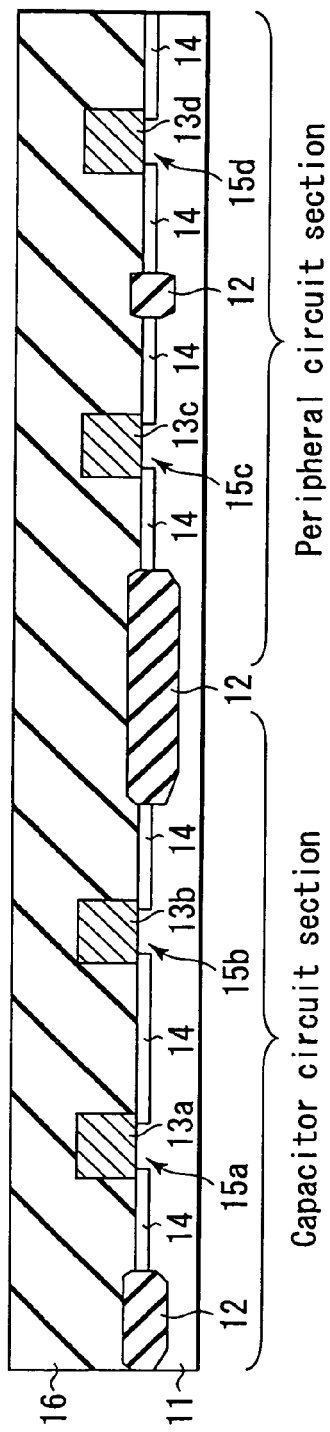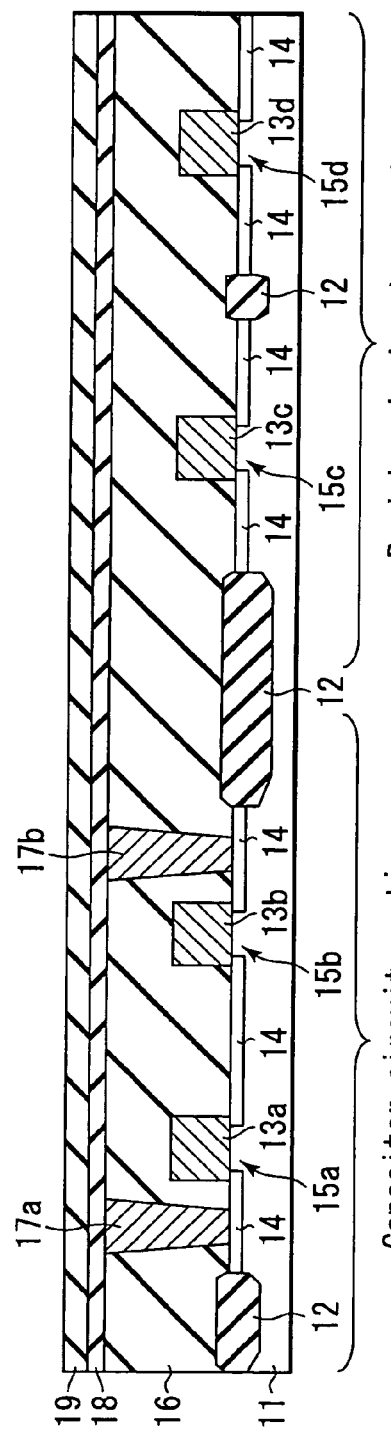
FIG. 3
FIG. 4

FERRO-ELECTRIC MEMORY DEVICE AND METHOD OF MANUFACTURING THE SAME

CROSS-REFERENCE TO RELATED APPLICATIONS

This application is based upon and claims the benefit of priority from prior Japanese Patent Application No. 2004-28099, filed Feb. 4, 2004, the entire contents of which are incorporated herein by reference.

BACKGROUND OF THE INVENTION

1. Field of the Invention

The present invention relates to a ferro-electric memory device having a ferro-electric capacitor and a method of manufacturing a ferro-electric memory device.

2. Description of the Related Art

In recent years, much attention has been paid to which is the ferro-electric random access memory (FeRAM), a non-volatile memory using a ferro-electric capacitor.

A conventional FeRAM is formed using, for example, the following process. First, a transistor is formed on a semiconductor substrate. Then, an interlayer insulating film is deposited on the transistor. The interlayer insulating film is then flattened. Then, a lower electrode, a ferro-electric film, and an upper electrode constituting a ferro-electric capacitor are sequentially deposited on the interlayer insulating film. Subsequently, the lower electrode, the ferro-electric film, and the upper electrode are processed by dry etching to form a ferro-electric capacitor.

Such a conventional FeRAM has the following problems. As described above, a dry etching technique is used to process the ferro-electric capacitor. However, the dry etching may damage the ferro-electric capacitor. Moreover, the dry etching may result in the formation of a fence which may in turn induce capacitor leakage. As the ferro-electric capacitor becomes finer-grained in association with an increase in its degree of integration, the capacitor damage and capacitor leakage become severer and are not negligible.

BRIEF SUMMARY OF THE INVENTION

According to a first aspect of the present invention, a ferro-electric memory device comprises a semiconductor substrate, a first transistor formed on the semiconductor substrate, and a first ferro-electric capacitor electrically connected to the first transistor and formed of a first capacitor material layer having a first lower electrode, a first ferro-electric film, and a first upper electrode, the first ferro-electric capacitor being thicker at its central portion than at its ends.

According to a second aspect of the present invention, a method of manufacturing a ferro-electric memory device comprises forming a first transistor on a semiconductor substrate, forming a first insulating film on the first transistor and semiconductor substrate, forming a mask layer on the first insulating film, forming a first opening in the mask layer, using the mask layer to remove the first insulating film and forming a first groove in the first insulating film, using sputtering to deposit a first lower electrode, a first ferro-electric film, and a first upper electrode on the mask layer and in the first groove and forming a first ferro-electric capacitor in the first groove in a self-aligned manner, and removing the first lower electrode, first ferro-electric film, and first upper electrode from the mask layer.

BRIEF DESCRIPTION OF THE SEVERAL VIEWS OF THE DRAWING

FIGS. 2 to 11 are sectional views showing a process of manufacturing a ferro-electric memory device according to the first embodiment of the present invention;

DETAILED DESCRIPTION OF THE INVENTION

Figure 1:
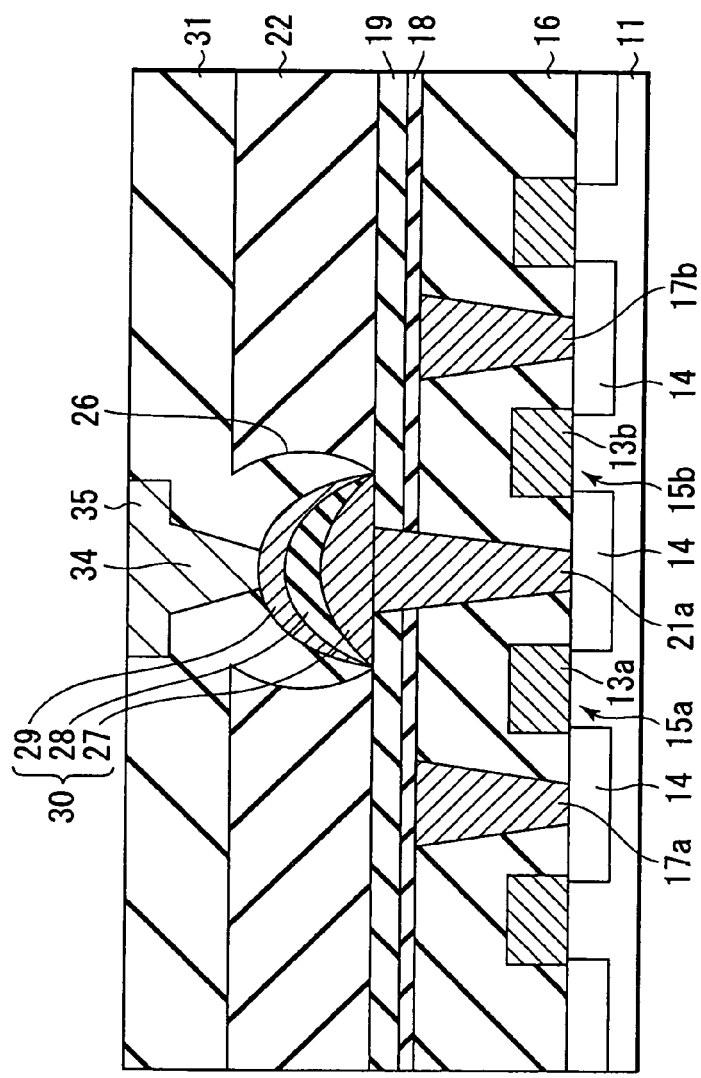
FIG. 1 is a sectional view showing a ferro-electric memory device according to a first embodiment of the present invention.

Embodiments of the present invention will be described below with reference to the drawings. In this description, common parts in the drawings are denoted by common reference numerals.

[First Embodiment]

In a first embodiment, a groove is formed in an interlayer insulating film. Then, a lower electrode, a ferro-electric film, and an upper electrode are sequentially deposited in the groove by sputtering. Thus, a capacitor is formed without using dry etching.

FIG. 1 is a sectional view of a ferro-electric memory device according to a first embodiment of the present invention. Description will be given below of the structure of a ferro-electric memory device according to the first embodiment of the present invention.

As shown in FIG. 1, transistors 15a and 15b are formed by forming source/drain diffusion layers 14 in a silicon substrate 11 and forming gate electrodes 13a and 13b on a silicon substrate 11. A contact 21a is connected to one of the source/drain diffusion layers 14 of each of the transistors 15a and 15b. Contacts 17a and 17b are connected to the other source/drain diffusion layer 14 of each of the transistors 15a and 15b.

A ferro-electric capacitor 30 having a lower electrode 27, a ferro-electric film 28, and an upper electrode 29 is formed on the contact 21a. Each of the lower electrode 27, ferro-electric film 28, and upper electrode 29 is thicker at its central portion than at its ends. Accordingly, the ferro-electric capacitor 30 does not have a uniform height and is highest in its central portion. Furthermore, the ferro-electric capacitor 30 does not have any angular ends on its top surface as in the case of the prior art. Consequently, the ferro-electric capacitor 30 has a generally curved, bowl-like top surface.

The ferro-electric capacitor 30 is surrounded by the interlayer insulating film 22. In other words, a capacitor groove 26 is formed in the interlayer insulating film 22. The ferro-electric capacitor 30 is formed in the capacitor groove 26. In this case, the capacitor groove 26 is formed by removing the interlayer insulating film 22 by isotropic etching. Accordingly, sides of the capacitor groove 26 are curved so as to protrude outward (so that sides of the interlayer insulating film 22 are recessed inward).

The lower electrode 29 is formed of a conductive material having an oxygen diffusion prevention effect and containing, for example, Ir, $IrO_2$, Ru, $RuO_2$, or Pt. An insulating oxygen diffusion prevention film 18 composed of, for example, TiN or TiAlN is formed on the contacts 17a and 17b. In this manner, the lower electrode 27, having the oxygen diffusion prevention effect, prevents the contact 21a from being oxidized; The oxygen diffusion prevention film 18 prevents the contacts 17a and 17b from being oxidized. An oxygen barrier film may be provided all over the surface (the top surface of the interlayer insulating film 19) located immediately below the capacitor.

FIGS. 2 to 11 are sectional views of a process of manufacturing a ferro-electric memory device according to the first embodiment of the present invention. Description will be given of a method of manufacturing a ferro-electric memory device according to the first embodiment. Here, an example will be given in which a capacitor circuit section having a ferro-electric capacitor and a peripheral circuit section controlling the capacitor circuit section are simultaneously formed.

Figure 2:
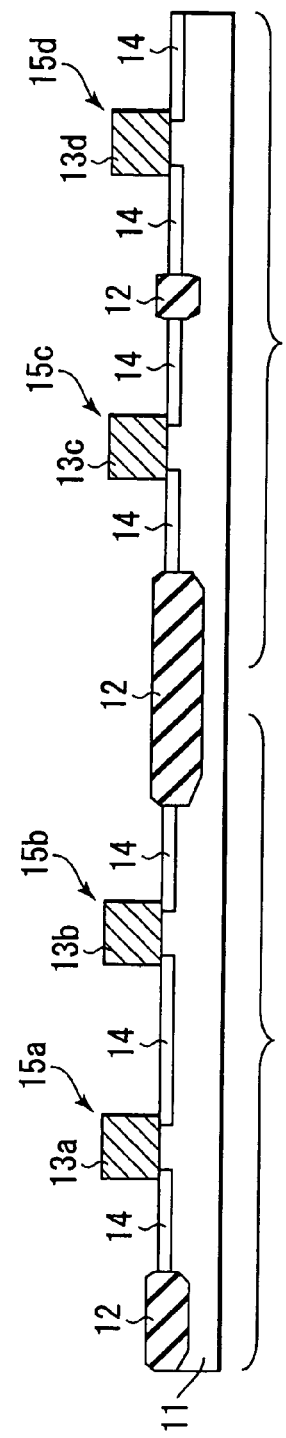

First, as shown in FIG. 2, shallow trench isolation (STI) areas 12 are formed on a silicon substrate 11 to separate elements from each other. Subsequently, the gate elements 13a, 13b, 13c, and 13d are formed on the silicon substrate 11. The source/drain layers 14 are formed so as to sandwich each of the gate electrodes 13a, 13b, 13c, and 13d between the layers 14. In this manner, the transistors 15a and 15b, constituting the capacitor circuit section, and transistors 15c and 15d constituting the peripheral circuit section are formed.

Then, as shown in FIG. 3, the interlayer-insulating film 16 is deposited on the silicon substrate 11 and transistors 15a, 15b, 15c, and 15d. The top surface of the interlayer insulating film 16 is flattened by chemical mechanical polish (CMP). A material for the interlayer insulating film 16 includes, for example, BPSG (Boron Phosphorous Silicate Glass), P-TEOS (Plasma-Tetra Ethoxy Silane), or the like.

Then, as shown in FIG. 4, the contacts 17a and 17b are formed in the interlayer insulating film 16 so as to be connected to the source/drain diffusion layers 14, respectively. Then, the oxygen diffusion prevention film 18 is formed on the contacts 17a and 17b and interlayer insulating film 16. The interlayer insulating film 19 is then deposited on the oxygen diffusion prevention film 18. In this case, the material for the oxygen diffusion prevention film 18 includes, for example, TiN or TiAlN. The material for the interlayer insulating film 19 includes, for example, BPSG or P-TEOS.

Figure 5:
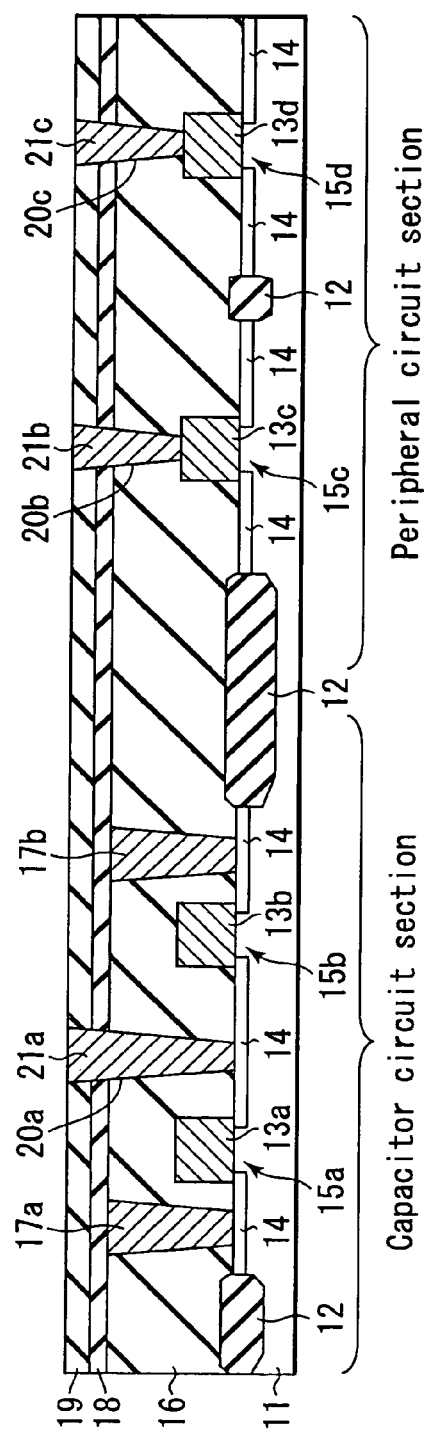

Then, as shown in FIG. 5, the interlayer insulating films 16 and 19 and the oxygen diffusion prevention film 18 are selectively removed to open contact holes 20a, 20b, and 20c. Subsequently, a metal material is buried in the contact holes 20a, 20b, and 20c and then flattened. Thus, contacts 21a, 21b, and 21c are formed. The material for the contacts 21a, 21b, and 21c includes, for example, W (tungsten) or doped polycrystal silicon. In this case, the contact 21a, constituting the capacitor circuit section, is connected to the source/drain diffusion layer 14. The contacts 21b and 21c, constituting the peripheral circuit section, are connected to the gate electrodes 13c and 13d, respectively.

Figure 6:
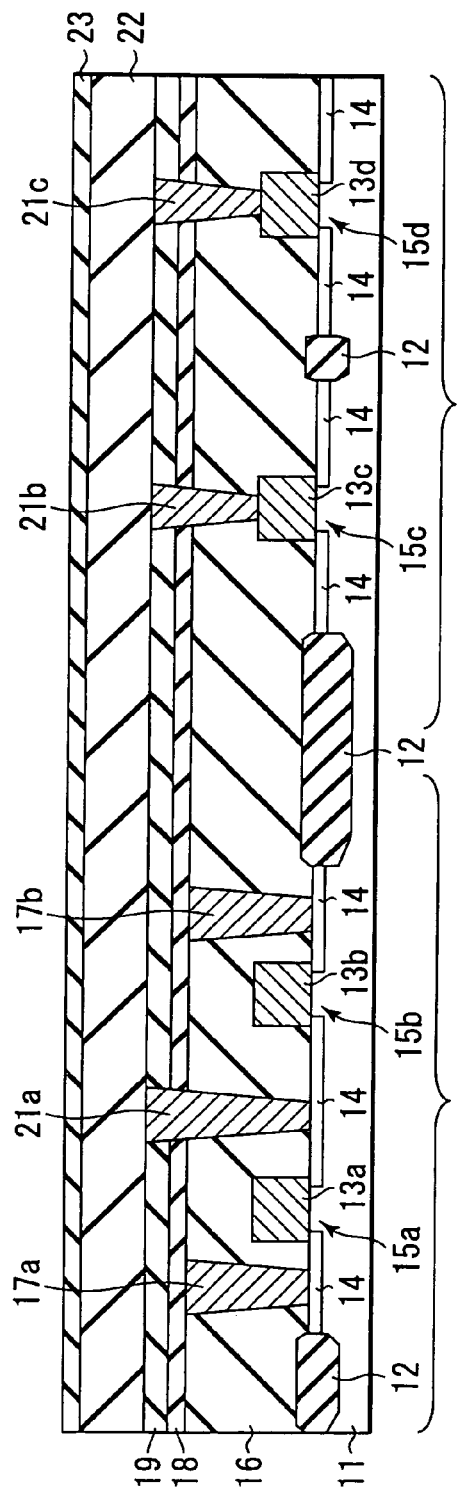

Then as shown in FIG. 6, a interlayer insulating film 22 is formed on the contacts 21a, 21b and 21c and the interlayer insulating film 19. A pin hole mask layer 23 is then formed on the interlayer insulating film 22. The pin hole mask layer is desirably formed of a material having a certain processing selection ratio of the pin hole mask layer 23 to the interlayer insulating film 22. If for example, the interlayer insulating film 22 is formed of an $SiO_2$ film, then the pin hole mask layer 23 may be formed of an SiON film, an SiN film, a polysilicon film, a $TiO_2$ film, an $Al_2O_3$ film, or the like.

Figure 7:
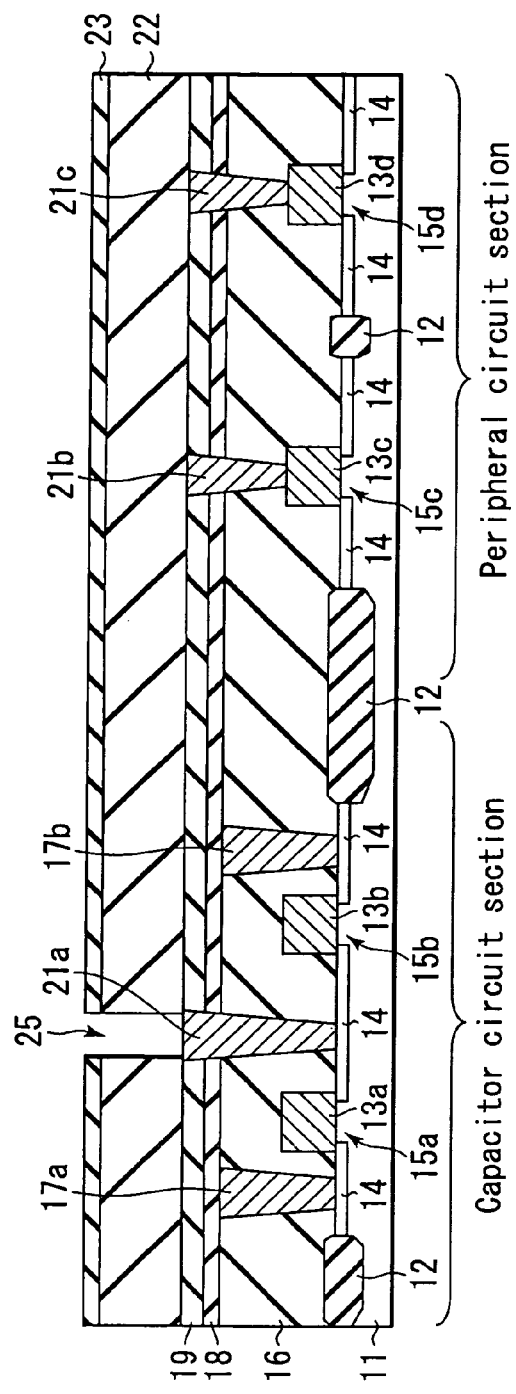

Then as shown in FIG. 7, the pin hole mask layer 23 is processed into a predetermined pattern to form an opening 24. Subsequently, the pin hole mask layer 23 is used to remove the interlayer insulating film by anisotropic etching such as RIE (Reactive Ion Etching). A groove 25 is formed which exposes the contact 21a.

Figure 8:
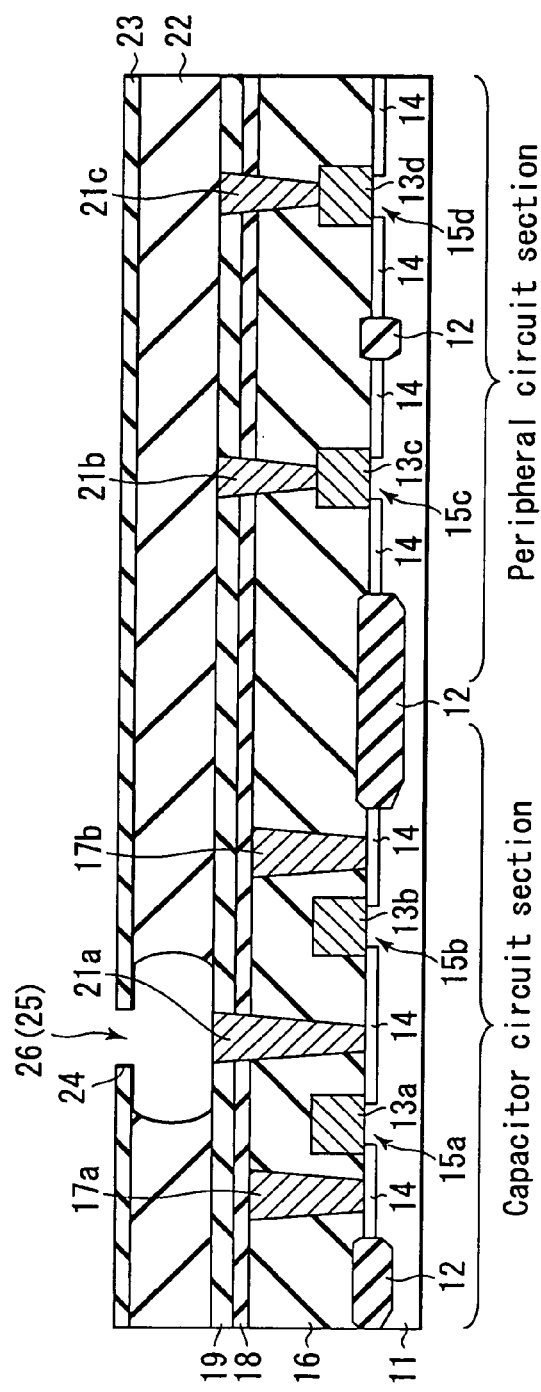

Then, as shown in FIG. 8, the pin hole mask layer 23 is used to further remove the interlayer insulating film 22 by isotropic etching such as CDE (Chemical Dry Etching) or wet etching to increase the size of the groove 25. This results in the formation of a capacitor groove 26 wider than the opening 24.

Figure 9:
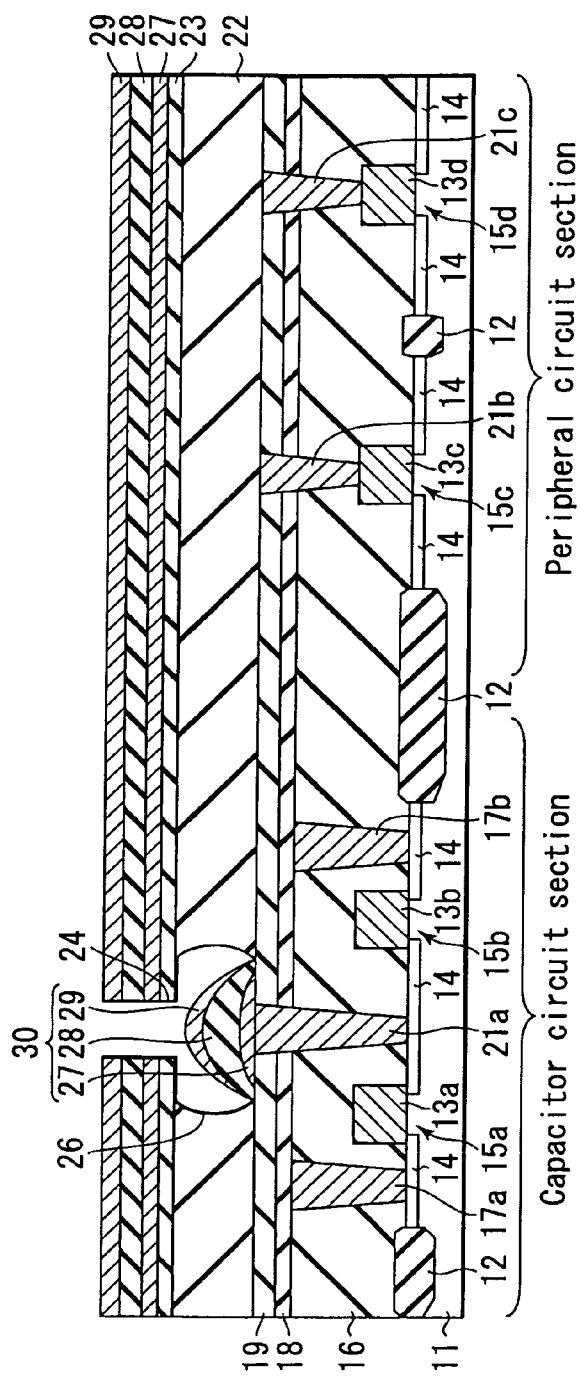

Then, as shown in FIG. 9, the lower electrode 27, the ferro-electric film 28, and the upper electrode 29 are sequentially formed on the pin hole mask layer 23 by sputtering. In this case, the lower electrode 27, ferro-electric film 28, and upper electrode 29 are also sequentially deposited inside the capacitor groove 26 through the opening 23 in the pin hole mask layer 23. Accordingly, the ferro-electric capacitor 30, composed of the lower electrode 27, ferro-electric film 28, and upper electrode 29, is formed inside the capacitor groove 26 in a self-aligned manner.

The lower electrode 27 is formed of a material containing one of, for example, Pt, Ir, $IrO_2$, SRO, Ru, and RuO. The ferro-electric film 28 is formed of a material containing one of, for example, PZT and SBT. The upper electrode 29 is formed of one of, for example, Pt, Ir, $IrO_2$, SRO, Ru, and $RuO_2$.

Figure 10:
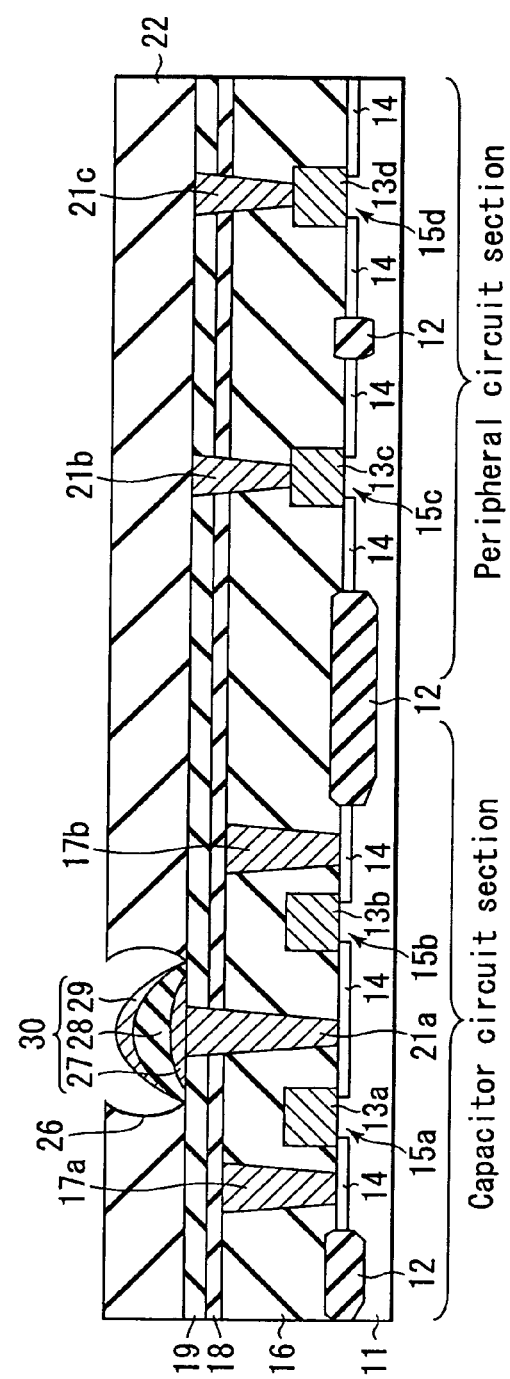

Then, as shown in FIG. 10, the pin hole mask layer 23, the lower electrode 27, the ferro-electric film 28, and the upper electrode 29 formed on the interlayer insulating film 22 are removed by, for example, CMP or liftoff.

Figure 11:
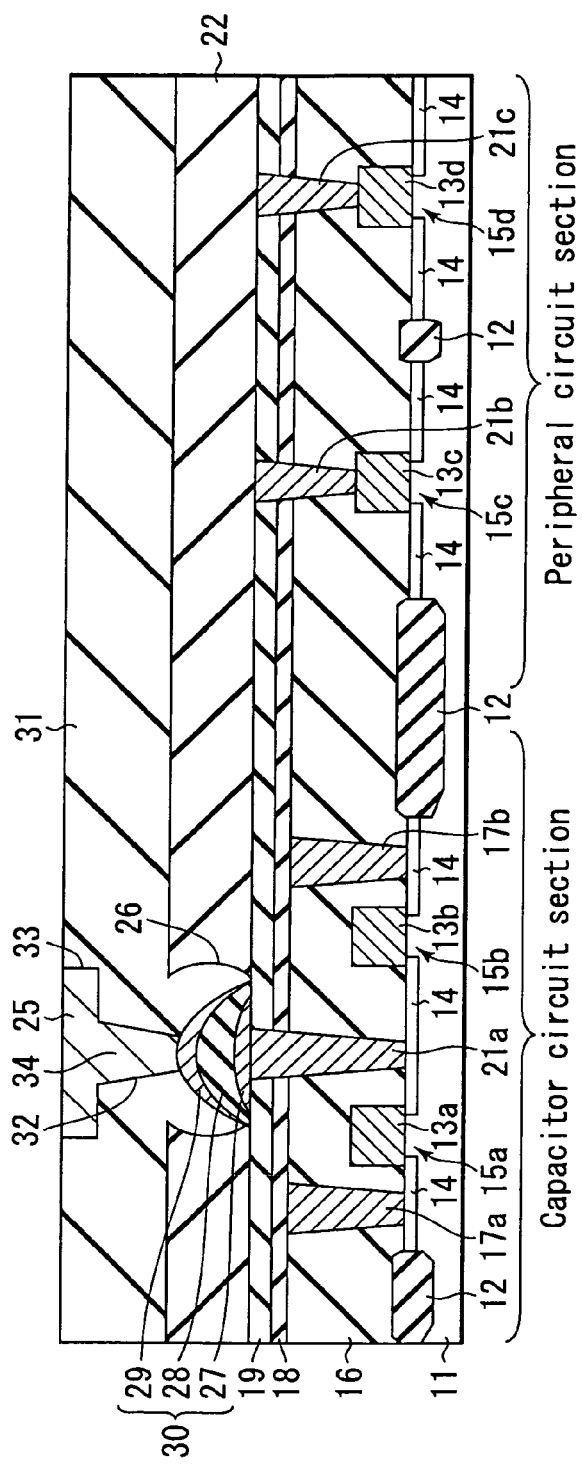

Then, as shown in FIG. 11, the interlayer insulating film 31 is formed on the interlayer insulating film 22 and capacitor 30. The top surface of the interlayer insulating film 31 is flattened by CMP. The material for the interlayer insulating film 31 includes, for example, P-TEOS, $O_3$-TEOS, SOG, $Al_2O_3$, SiN, or SiON. Then, the interlayer insulating film 31 is selectively removed to form a contact hole 32 and an interconnect groove 33. Subsequently, high-temperature oxygen annealing is carried out in an oxygen atmosphere at 650° C. for one hour or under other conditions. Then, a metal material containing, for example, W, Al, or TiN is buried in the contact hole 32 and interconnect groove 33 to form a contact 34 and an interconnect 35.

According to the first embodiment, the ferro-electric capacitor material is deposited by sputtering after the capacitor groove 26 has been formed in the interlayer insulating film 22 for each cell using the opening 24 in the pin hole mask layer 23. Thus, the ferro-electric capacitor material is deposited on the pin hole mask layer 23 and in the capacitor groove 26 through the opening 24. Consequently, the opening 24 serves to separate the ferro-electric capacitor material into cells to form the ferro-electric capacitor 30 in a self-aligned manner. Thus, while in the prior art, the ferro-electric capacitor material must be processed using dry etching, in the first embodiment, the ferro-electric capacitor 30 can be formed for each cell using only sputtering. Accordingly, the ferro-electric capacitor can be formed without using the dry etching technique. This inhibits processing damage caused by dry etching and capacitor leakage induced by a fence that may be formed during dry etching, both of which may occur in conventional ferro-electric capacitors. Therefore, reliable, fine capacitors can be easily implemented.

Furthermore, the ferro-electric capacitor 30 is formed like a bowl by sputtering. This enables the effective area of the capacitor to be increased. It is thus possible to manufacture ferro-electric memory devices without reducing the amount of signals in spite of an increase in degree of integration.

Moreover, the capacitor groove 26 is formed by forming the interlayer insulating film 33 by anisotropic etching and then removing it by isotropic etching. Thus, the capacitor groove 26 is formed to be wider than the opening 24 in the pin hole mask layer 23. This enables the size of an inlet of the capacitor groove 26 to be reduced to form the bowl-like ferro-electric capacitor 30.

[Second Embodiment]

In a second embodiment, the ferro-electric capacitor according to the first embodiment has a TC parallel unit series connected type structure (Series connected TC unit type ferroelectric RAM). In the TC parallel unit series connected type structure, the opposite ends of a capacitor (C) are connected between a source and a drain of a cell transistor (T) to form a unit cell. Then, a plurality of such unit cells are connected together in series.

Figure 12:
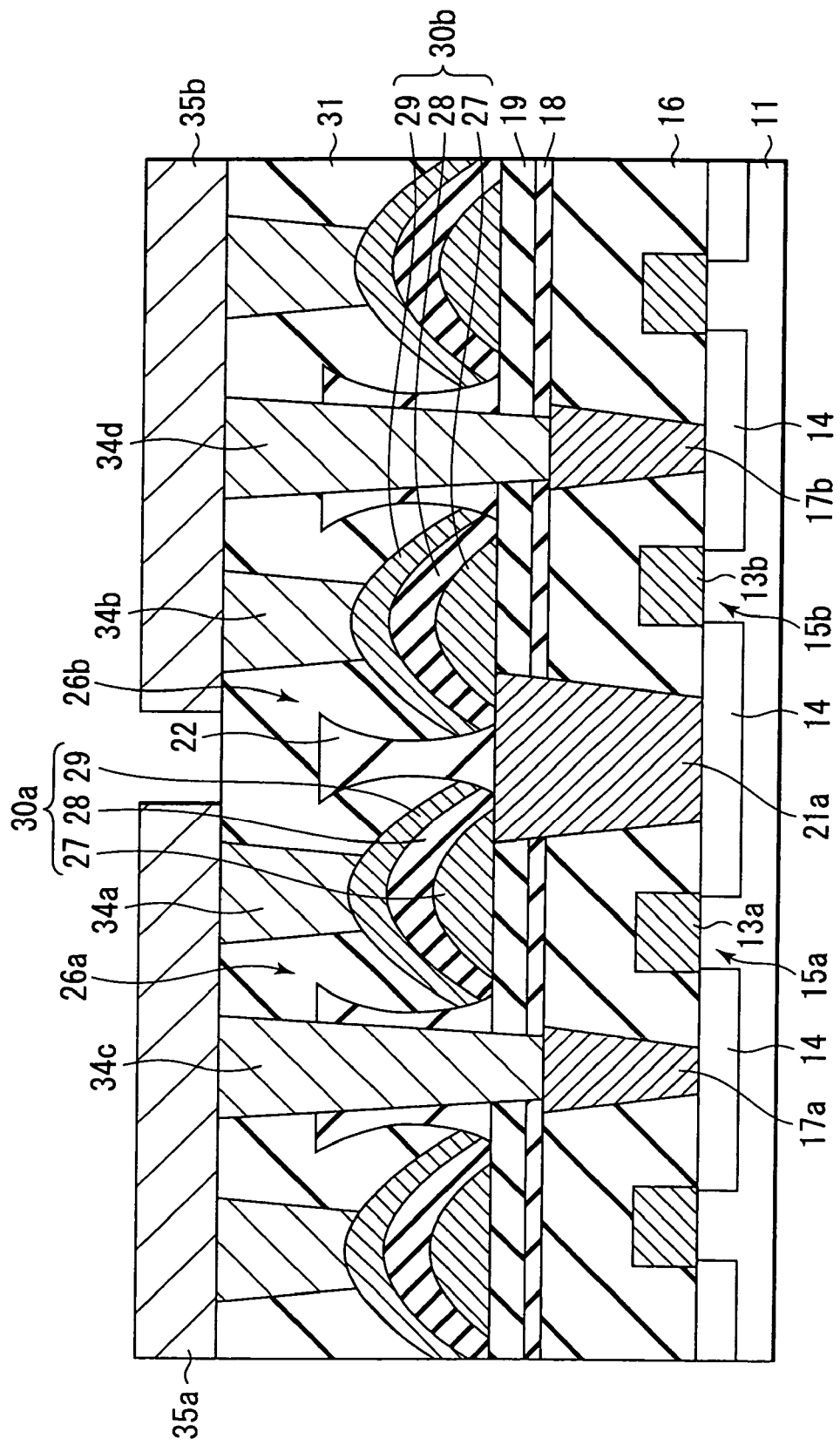
FIG. 12 is a sectional view showing a ferro-electric memory device according to a second embodiment of the present invention.

FIG. 12 is a sectional view of a ferro-electric memory device according to the second embodiment. As shown in FIG. 12, the second embodiment is different from the first embodiment in that the ferro-electric capacitor has the TC parallel unit series connected type structure. Specifically, this structure is as described below.

In a first cell, the lower electrode 27 of the capacitor 30a is electrically connected to one of the source/drain diffusion layers 14 of the transistor 15a via the contact 21a. The upper electrode 29 of the capacitor 30a is electrically connected to the other source/drain diffusion layer 14 via the contacts 17a, 34a, and 34c and the interconnect 35a. This results in electric parallel connection between the source/drain diffusion layer 14 of the transistor 15a and the upper electrode 29 and lower electrode 27 of the capacitor 30a.

In a second cell, the lower electrode 27 of the capacitor 30b is electrically connected to one of the source/drain diffusion layers 14 of the transistor 15b via the contact 21a. The upper electrode 29 of the capacitor 30b is electrically connected to the other source/drain diffusion layer 14 via the contacts 17b, 34b, and 34d and the interconnect 35b. This results in the electric parallel connection between the source/drain diffusion layer 14 of the transistor 15b and the upper electrode 29 and lower electrode 27 of the capacitor 30b.

The first and second cells are electrically connected by using the contact 21a to connect both transistors 15a and 15b to the lower electrode 27.

FIGS. 13 to 17 are sectional views showing a process of manufacturing a ferro-electric memory device according to a second embodiment of the present invention. Description will be give of a method of manufacturing a ferro-electric memory device according to the second embodiment of the present invention. As in the case of the first embodiment, an example will be given in which the capacitor circuit section and the peripheral circuit section are simultaneously formed.

First, as shown in FIGS. 2 to 6, as in the case of the first embodiment, the interlayer insulating film 22 is formed on the contacts 21a, 21b, and 21c and interlayer insulating film 19. Then, the pin hole mask layer 23 is formed on the interlayer insulating film 22.

Figure 13:
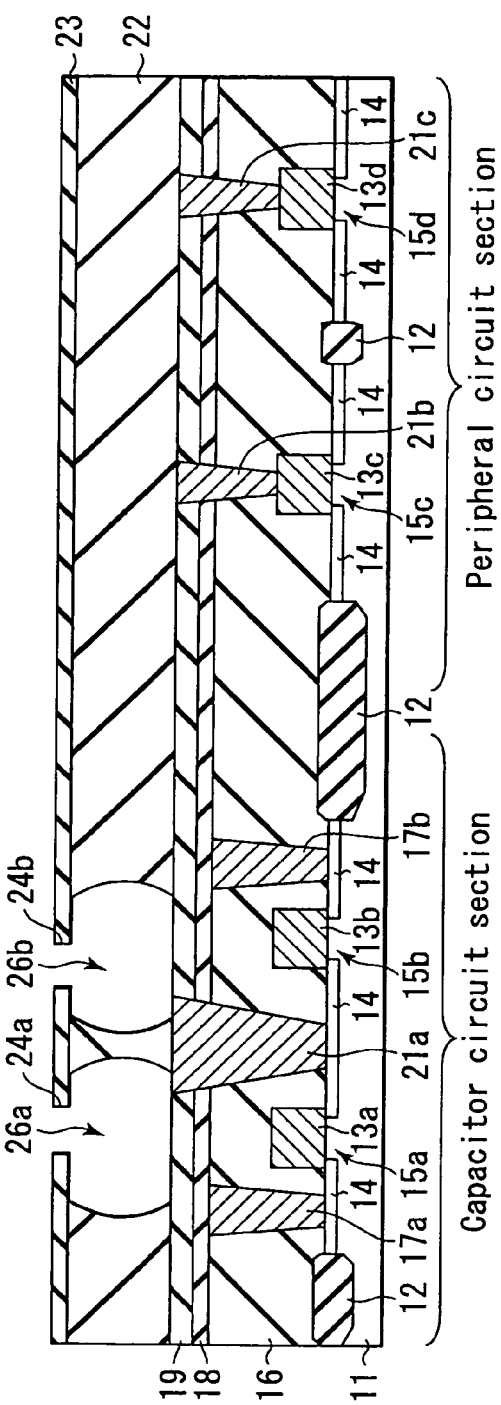
FIGS. 13 to 17 are sectional views showing a process of manufacturing a ferro-electric memory device according to the second embodiment of the present invention.

Then, as shown in FIG. 13, the pin hole mask layer 23 is processed into a predetermined pattern to form openings 24a and 24b. Subsequently, the pin hole mask layer 23 is used to remove the interlayer insulating film 22 by anisotropic etching. Moreover, the interlayer insulating film 22 is removed by isotropic etching to form capacitor grooves 26a and 22b which expose the contact 21a.

Figure 14:
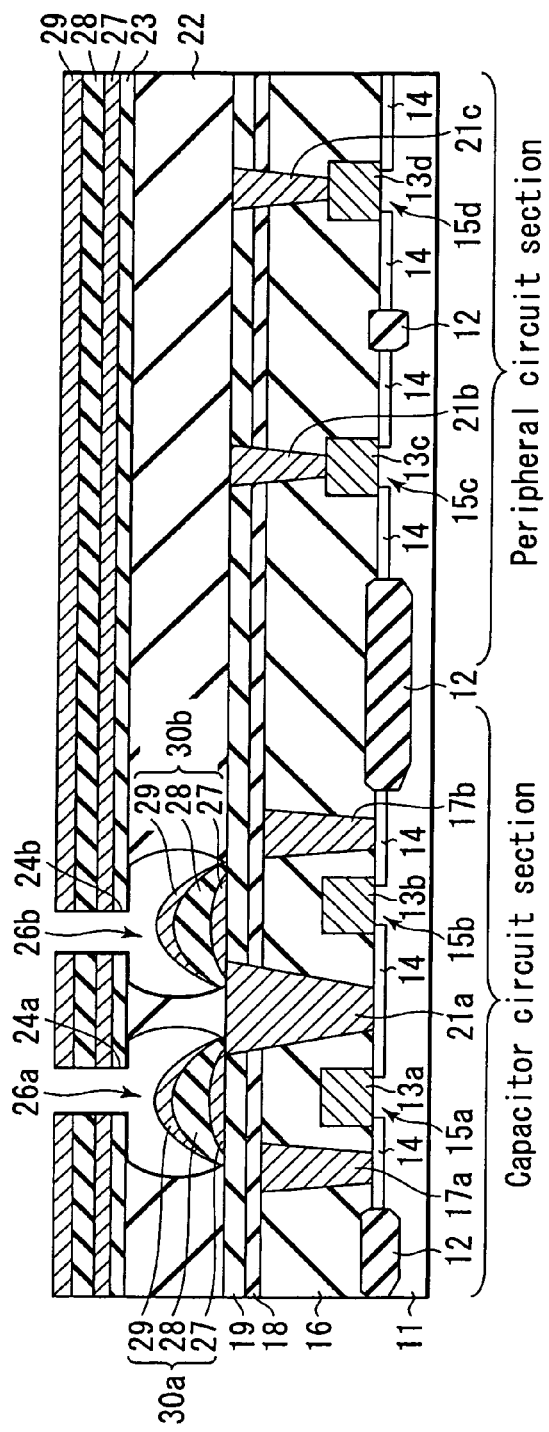

Then, as shown in FIG. 14, the lower electrode 27, the ferro-electric film 28, and the upper electrode 29 are sequentially formed on the pin hole mask layer 23 by sputtering. In this case, the lower electrode 27, ferro-electric film 28, and upper electrode 29 are also sequentially deposited inside the capacitor groove 26a and a capacitor groove 26b through the openings 24a and 24b, respectively, in the pin hole mask layer 23. Accordingly, the ferro-electric capacitors 30a and 30b, each composed of the lower electrode 27, ferro-electric film 28, and upper electrode 29, are formed inside the capacitor grooves 26a and 26b, respectively, in a self-aligned manner.

Figure 15:
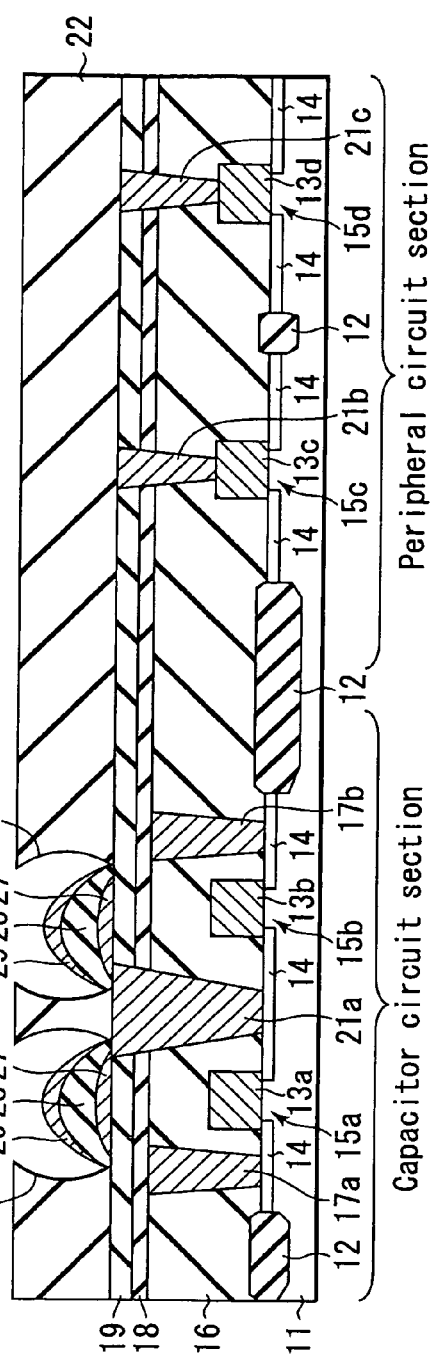

Then, as shown in FIG. 15, the pin hole mask layer 23, the lower electrode 27, the ferro-electric film 28, and the upper electrode 29 formed on the interlayer insulating film 22 are removed by, for example, CMP or liftoff.

Figure 16:
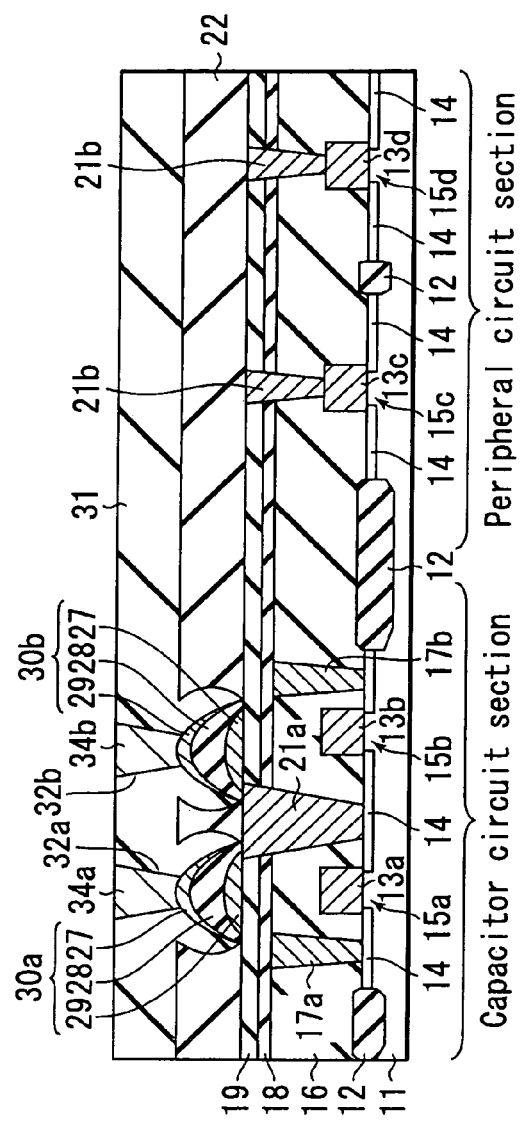

Then, as shown in FIG. 16, the interlayer insulating film 31 is formed on the interlayer insulating film 22 and capacitors 30a and 30b. Then, the interlayer insulating film 31 is selectively removed to form contact holes 32a and 32b. Subsequently, high-temperature oxygen annealing is carried out in an oxygen atmosphere at 650° C. for one hour or under other conditions. Then, a metal material is buried in the contact holes 32a and 32b to form contacts 34a and 34b.

Figure 17:
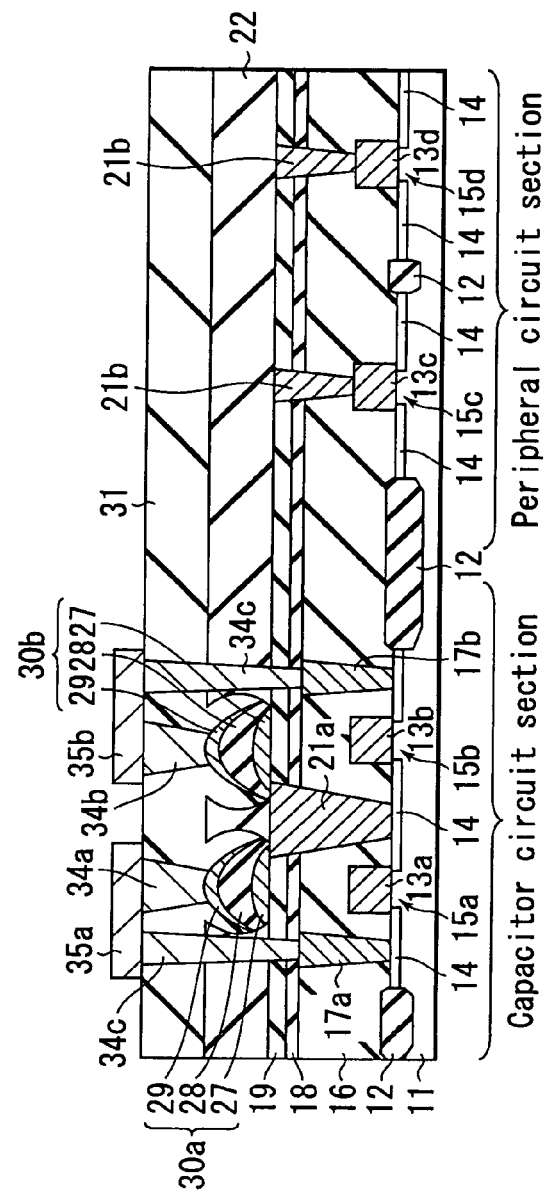

Then, as shown in FIG. 17, contacts 34c and 34d are formed which are connected to the contacts 17a and 17b. Then, the interconnects 35a and 35b are formed which connect the contacts 34c and 34d to the contacts 34a and 34b, respectively.

According to the second embodiment, it is possible to produce not only effects similar to those of the first embodiment but also the effects described below.

If the TC parallel unit series connected type structure is formed by the dry etching technique, the prior art may create problems including not only damage to the capacitor and leakage induced by a possible fence but also the need for two lithography steps. In contrast, in the second embodiment, the omission of the dry etching technique serves not only to avoid the problems of damage to the capacitor and leakage induced by a possible fence but also to reduce the number of lithography steps to one. Therefore, costs can also be reduced.

[Third Embodiment]

A third embodiment is a variation of the second embodiment. According to this variation, in the TC parallel unit series connected type structure, a contact with an upper electrode of a ferro-electric capacitor and a contact with a contact plug on a source/drain are formed at a time.

Figure 18:
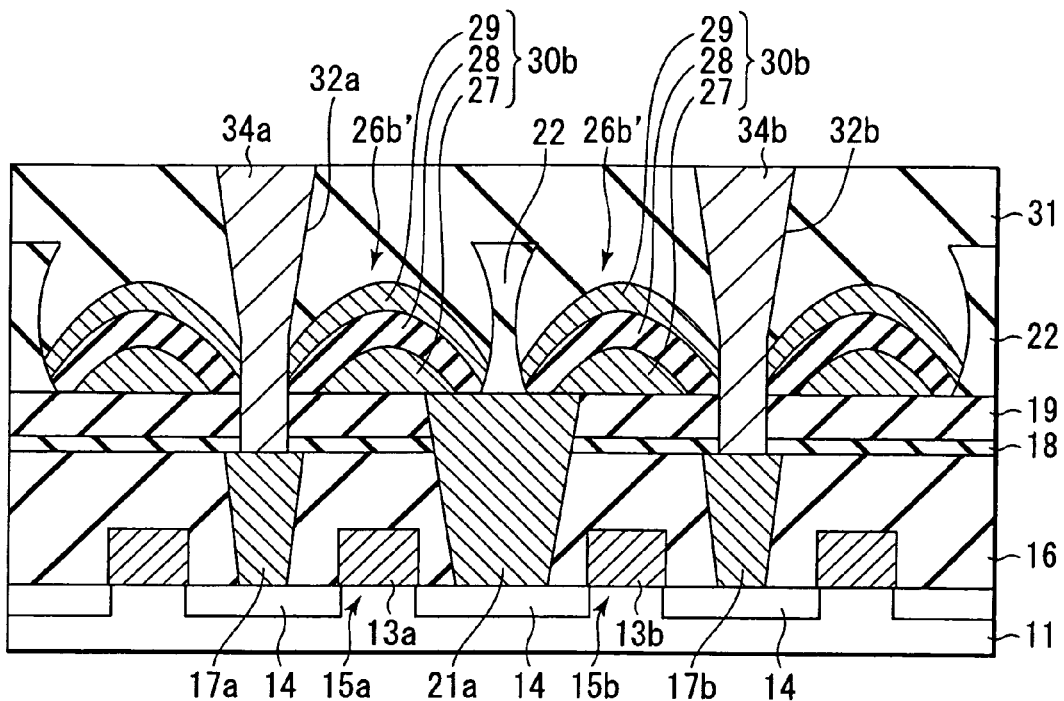
FIG. 18 is a sectional view showing a ferro-electric memory device according to a third embodiment of the present invention.

FIG. 18 is a sectional view of a ferro-electric memory device according to a third embodiment of the present invention. In the second embodiment, the contacts 34a, 34b, 34c, and 34d and the interconnects 35a and 35b are used to connect the upper electrodes 29 of the ferro-electric capacitors 30a and 30b to the contacts 17a and 17b on the source/drain diffusion layers 14, respectively. However, in the third embodiment, only the contacts 34a and 34b are used.

Specifically, the contacts 34a and 34b are provided adjacent to the corresponding upper electrodes 29 so as to be used to connect the upper electrodes 29 to the contacts 17a and 17b, respectively. In this case, each of the upper electrodes 29 is formed to be wider than each of the lower electrodes 27 so as to cover the lower electrode 27. Consequently, the lower electrode 27 does not contact with the contact 17a or 17b, but only the upper electrode 29 contacts with it.

FIGS. 19 to 23 are sectional views of a process of sectional views showing a process of manufacturing a ferro-electric memory device according to a third embodiment of the present invention. Description will be give of a method of manufacturing a ferro-electric memory device according to the third embodiment of the present invention.

First, as shown in FIGS. 2 to 6, as in the case of the first embodiment, the interlayer insulating film 22 is formed on the contacts 21a, 21b, and 21c and interlayer insulating film 16. Then, the pin hole mask layer 23 is formed on the interlayer insulating film 22.

Figure 19:
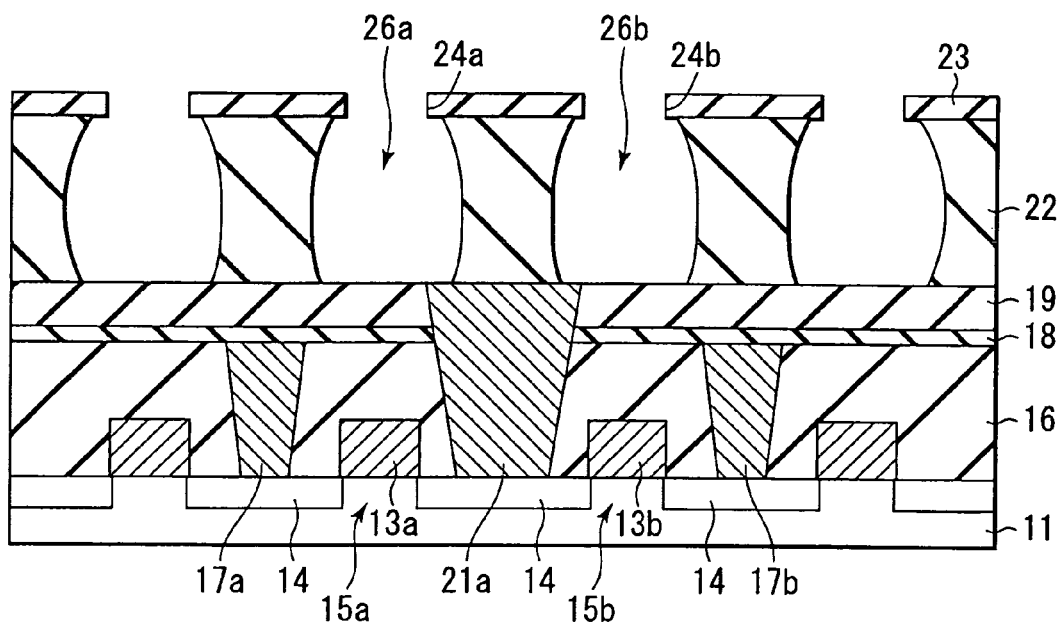
FIGS. 19 to 23 are sectional views showing a process of manufacturing a ferro-electric memory device according to the third embodiment of the present invention.

Then, as shown in FIG. 19, the pin hole mask layer 23 is processed into a predetermined pattern to form the openings 24a and 24b. Subsequently, the pin hole mask layer 23 is used to remove the interlayer insulating film 22 by anisotropic etching. Moreover, the interlayer insulating film 22 is removed by isotropic etching to form the capacitor grooves 26a and 26b.

Figure 20:
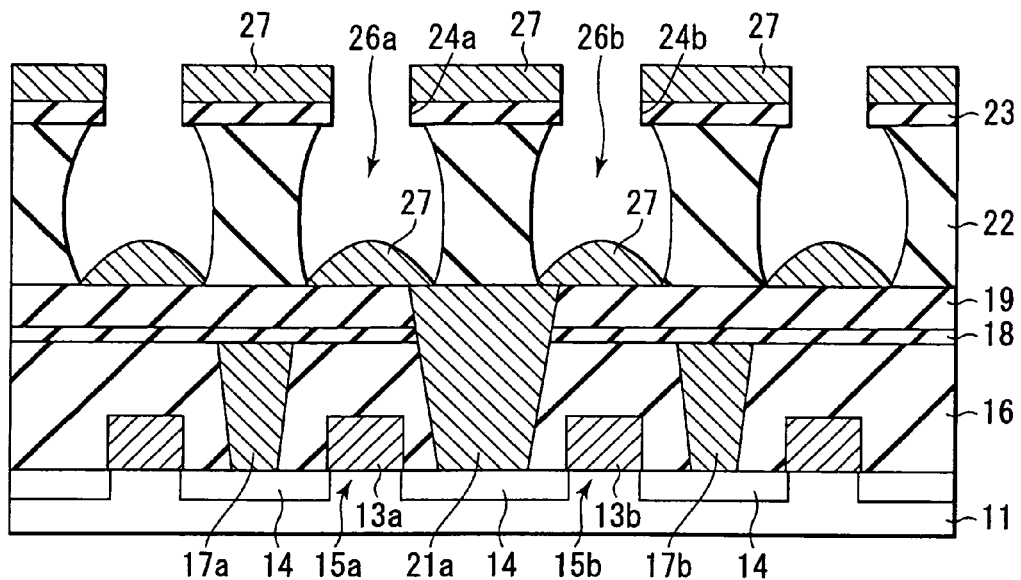

Then, as shown in FIG. 20, the lower electrode 27 is deposited on the pin hole mask layer 23 by sputtering. In this case, the lower electrode 27 is also deposited inside the capacitor grooves 26a and 26b through the openings 24a and 24b in the pin hole mask layer 23.

Figure 21:
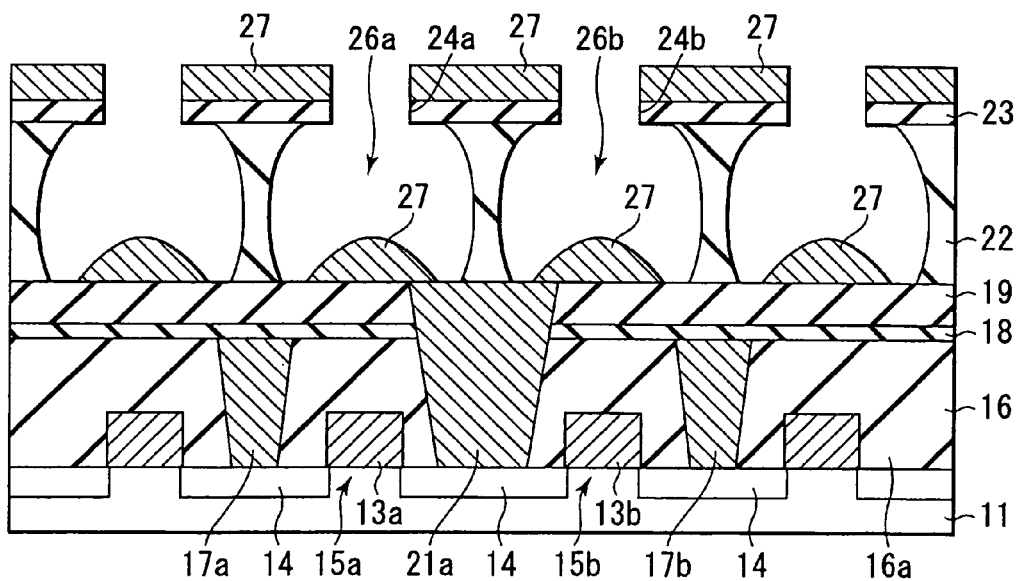

Then, as shown in FIG. 21, the interlayer insulating film 22 is further removed by isotropic etching to form further widened capacitor grooves 26a' and 26b'.

Figure 22:
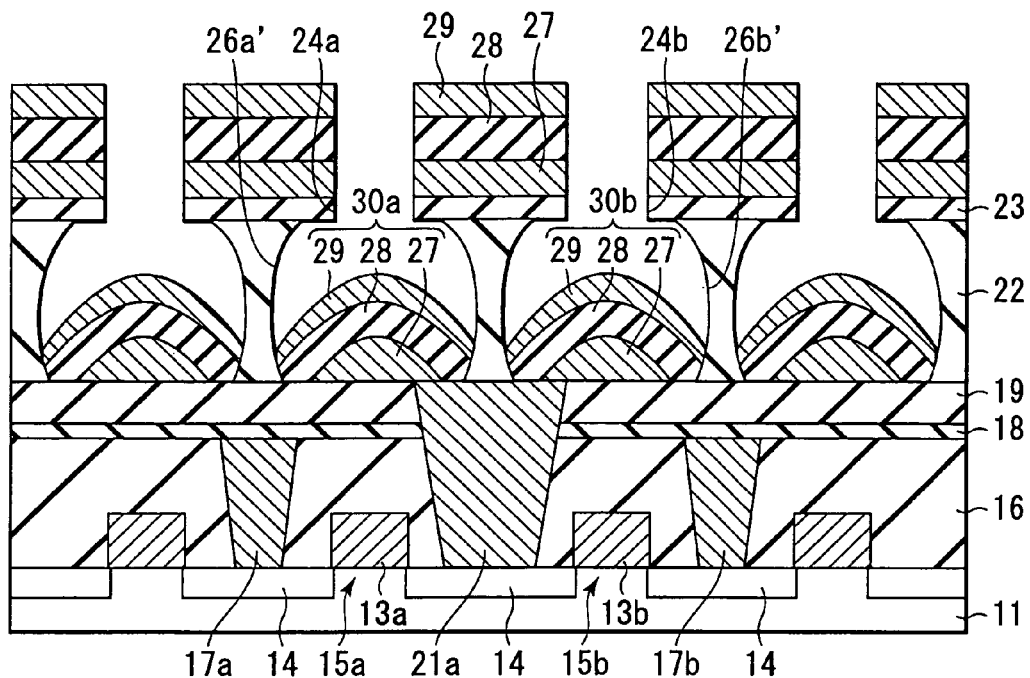

Then, as shown in FIG. 22, the ferro-electric film 28 and the upper electrode 29 are sequentially formed by sputtering. In this case, the ferro-electric film 28 and upper electrode 29 are also sequentially deposited inside the capacitor groove 26a' and 26b' through the openings 24a and 24b, respectively, in the pin hole mask layer 23. Accordingly, the ferro-electric capacitors 30a and 30b, each composed of the lower electrode 27, ferro-electric film 28, and upper electrode 29, are formed inside the capacitor grooves 26a' and 26b', respectively, in a self-aligned manner.

Figure 23:
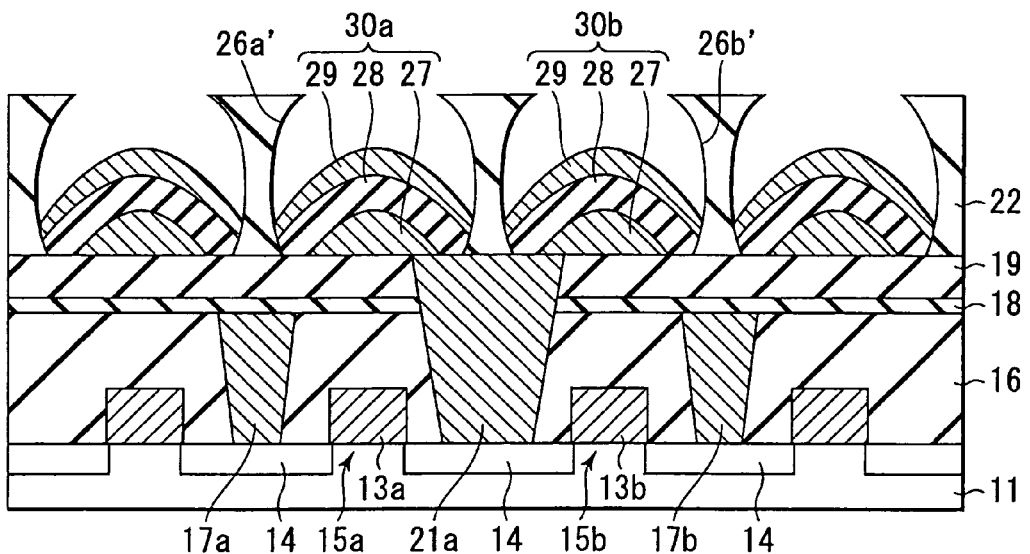

Then, as shown in FIG. 23, the pin hole mask layer 23, the lower electrode 27, the ferro-electric film 28, and the upper electrode 29 are removed from the interlayer insulating film 22 by, for example, CMP or liftoff.

Then, as shown in FIG. 18, the interlayer insulating film 31 is formed on the interlayer insulating film 22 and capacitors 30a and 30b. Then, the interlayer insulating films 19, 22, and 31 and the oxygen diffusion prevention film 18 are selectively removed to form the contact holes 32a and 32b. Subsequently, high-temperature oxygen annealing is carried out in an oxygen atmosphere at 650° C. for one hour or under other conditions. Then, a metal material is buried in the contact holes 32a and 32b. The top surface of the metal material is then flattened to form the contacts 34a and 34b in a self-aligned manner.

According to the third embodiment, it is possible to produce not only effects similar to those of the first embodiment but also the effects described below.

In the first embodiment, after the lower electrodes 27 have been formed inside the capacitor grooves 26a and 26b, respectively, the grooves 26a' and 26b', which are wider than the grooves 26a and 26b, are formed. Then, the ferro-electric film 28 and the upper electrode 29 are deposited on the lower electrode 27 inside each of the grooves 26a' and 26b'. Thus, the upper electrode 29 can be formed so as to cover the lower electrode 27. This enables the self-aligned formation of the contacts 34a and 34b, which electrically connect the upper electrodes 29, respectively, of the ferro-electric capacitors 30a and 30b to the contacts 17a and 17b, respectively, formed on the source drain diffusion layers 14 of the transistors 15a and 15n. Therefore, the third embodiment serves to reduce the number of required steps, while increasing the degree of integration compared to the second embodiment.

[Fourth Embodiment]

In a fourth embodiment, the ferro-electric capacitor in the first embodiment is varied to form a three-dimensional capacitor. The three-dimensional capacitor has an upper electrode, a ferro-electric film, and a lower electrode constituting a capacitor and at least one of which extends not only flatly in an XY direction but also stereoscopically in a Z direction.

Figure 24:
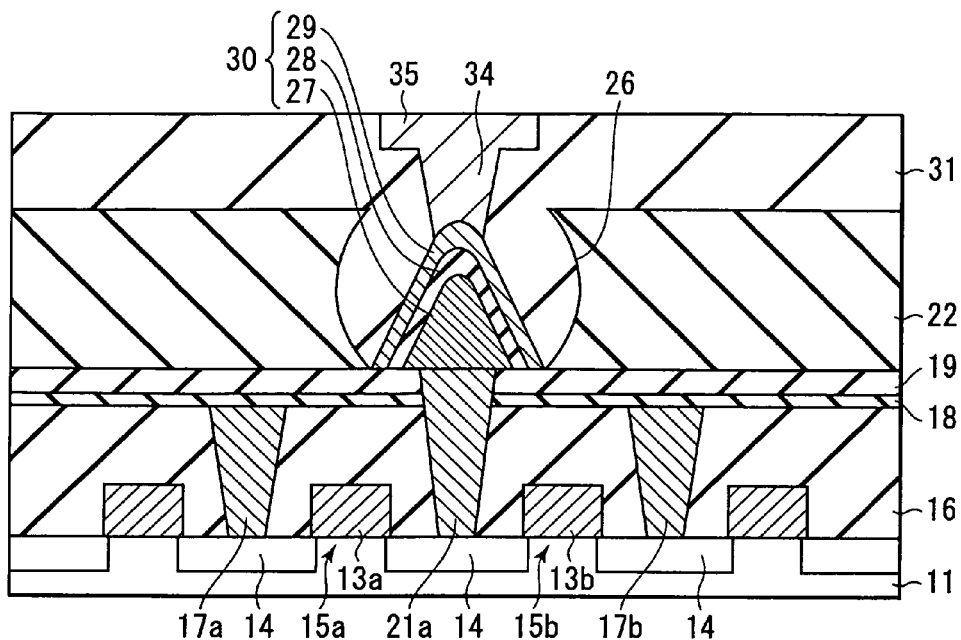
FIG. 24 is a sectional view showing a ferro-electric memory device according to a fourth embodiment of the present invention.
Figure 25:
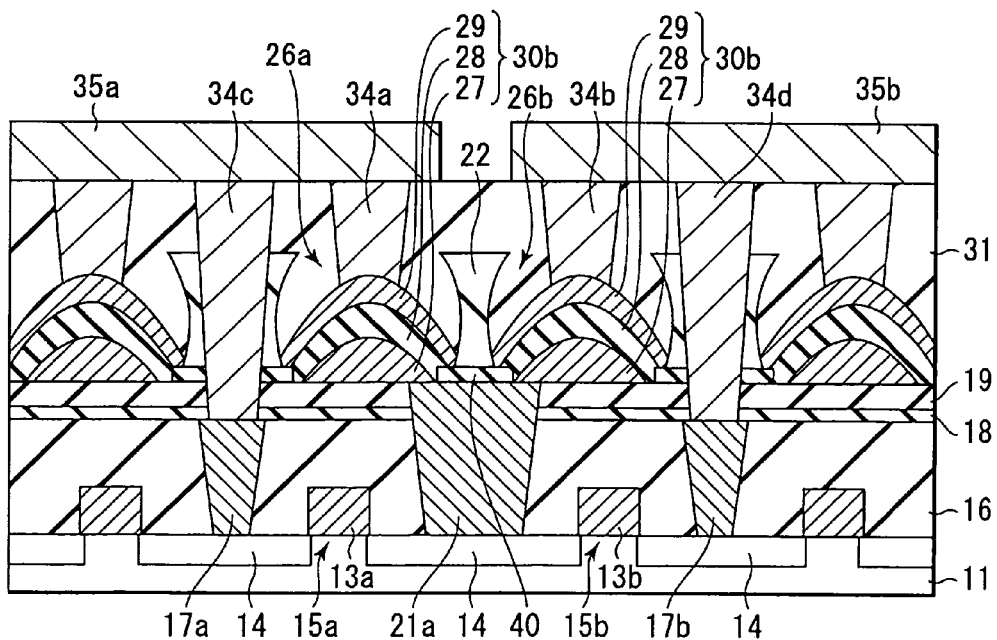
FIG. 25 is a sectional view showing the ferro-electric memory device according to each embodiment of the present invention.

FIG. 24 is a sectional view of a ferro-electric memory device according to a fourth embodiment of the present invention. The fourth embodiment differs from the first embodiment in that the ferro-electric capacitor 30 is formed three-dimensionally. Specifically, the three-dimensional capacitor can be implemented by increasing the thickness of the lower electrode 27 to shape the ferro-electric capacitor 30 like a triangular pyramid to form the ferro-electric film 28 and the upper electrode 29 three-dimensionally.

With the process according to the first embodiment, such a three-dimensional capacitor can be implemented by depositing each of the interlayer insulating film 22 and the lower electrode 27 to a greater thickness.

According to the third embodiment, it is possible to produce not only effects similar to those of the first embodiment but also the effects described below.

As the ferro-electric capacitor becomes finer-grained in association with an increase in the degree of integration of the ferro-electric memory device, a larger amount of signals are required to make the device reliable. It is thus essential to make the ferro-electric capacitor three-dimensional. Making the ferro-electric capacitor three-dimension is technically difficult. However, the fourth embodiment allows a three-dimensional capacitor 30 to be easily formed. The three-dimensional formation of the ferro-electric capacitor 30 leads to an effectively large capacitor area. This enables a sufficient amount of signals to be retained even in a fine-grained capacitor.

The present invention is not limited to the above described embodiments. In implementation, these embodiments may be varied without departing from the spirit of the present invention. For example, to prevent the contacts from being oxidized, it is allowable to stack the interlayer insulating film 22 and an insulating oxygen barrier film on each other. Specifically, an oxygen barrier film 40 may be formed on a part of the contact 21a so as not to prevent the electric connection between the contact 21a and the lower electrode 27.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ferro-electric memory device comprising: a semiconductor substrate;
   a first transistor formed on the semiconductor substrate;
   a first ferro-electric capacitor electrically connected to the first transistor and formed of a first capacitor material layer having a first lower electrode, a first ferro-electric film, and a first upper electrode, the first ferro-electric capacitor being thicker at its central portion than at its ends; and
   a first insulating film formed on the first transistor and the semiconductor substrate and having a groove with curved sides, and wherein the first ferro-electric capacitor is provided in the groove.

2. The ferro-electric memory device according to claim 1, wherein the first ferro-electric capacitor has a bowl shape with a curved top surface.

3. The ferro-electric memory device according to claim 1, wherein the first lower electrode is formed of a material having an oxygen diffusion prevention effect.

4. The ferro-electric memory device according to claim 1, further comprising:
   a second transistor formed on the semiconductor substrate; and
   a second ferro-electric capacitor electrically connected to the second transistor and formed of a second capacitor material layer having a second lower electrode, a second ferro-electric film, and a second upper electrode, the second ferro-electric capacitor being thicker at its central portion than at its ends, and
   wherein a first cell in which the first upper electrode and the first lower electrode are electrically connected in parallel with first sources/drains of the first transistor is electrically connected in series with a second cell in which the second upper electrode and the second lower electrode are electrically connected in parallel with second sources/drains of the second transistor.

5. The ferro-electric memory device according to claim 4, further comprising:
   a first contact provided adjacent to the first upper electrode to electrically connect the first upper electrode and one of the first sources/drains; and
   a second contact provided adjacent to the second upper electrode to electrically connect the second upper electrode and one of the second sources/drains.

6. The ferro-electric memory device according to claim 5, wherein the first upper electrode covers the first lower electrode, and the second upper electrode covers the second lower electrode.

* * * * *